United States Patent
Richmond et al.

(10) Patent No.: US 10,504,426 B2
(45) Date of Patent: Dec. 10, 2019

(54) SYSTEM AND METHOD FOR EXTERNAL PIXEL COMPENSATION

(71) Applicant: Apple Inc., Cupertino, CA (US)

(72) Inventors: Jesse Aaron Richmond, San Francisco, CA (US); Mohammad B. Vahid Far, San Jose, CA (US); Yafei Bi, Los Altos Hills, CA (US); Kingsuk Brahma, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 73 days.

(21) Appl. No.: 15/702,443

(22) Filed: Sep. 12, 2017

(65) Prior Publication Data

US 2018/0082635 A1 Mar. 22, 2018

Related U.S. Application Data

(60) Provisional application No. 62/398,097, filed on Sep. 23, 2016.

(51) Int. Cl.

| G09G 3/3233 | (2016.01) |
|---|---|
| G09G 3/00 | (2006.01) |
| G09G 3/3291 | (2016.01) |
| H03F 3/26 | (2006.01) |
| G09G 3/20 | (2006.01) |

(52) U.S. Cl.
CPC .......... *G09G 3/3233* (2013.01); *G09G 3/006* (2013.01); *G09G 3/2003* (2013.01); *G09G 3/3291* (2013.01); *H03F 3/265* (2013.01); G09G 2300/0809 (2013.01); G09G 2300/0819 (2013.01); G09G 2300/0842 (2013.01); G09G 2310/027 (2013.01); G09G 2320/0285 (2013.01); G09G 2320/0295 (2013.01); G09G 2320/045 (2013.01)

(58) Field of Classification Search
CPC ... G09G 2300/0809; G09G 2300/0819; G09G 2300/0842; G09G 2310/027; G09G 2320/0285; G09G 2320/0295; G09G 2320/045; G09G 3/006; G09G 3/2003; G09G 3/3233; G09G 3/3291; H03F 3/265
See application file for complete search history.

(56) References Cited

U.S. PATENT DOCUMENTS

| 7,504,979 | B1 | 3/2009 | Knausz et al. | |
|---|---|---|---|---|
| 10,008,172 | B2 * | 6/2018 | Li | G09G 3/3648 |
| 2008/0001800 | A1 | 1/2008 | Chang | |
| 2008/0079706 | A1 | 4/2008 | Chia | |
| 2013/0162617 | A1 * | 6/2013 | Yoon | G09G 3/3291 345/211 |
| 2015/0332638 | A1 | 11/2015 | Li et al. | |
| 2018/0005578 | A1 * | 1/2018 | Vahid Far | G09G 3/3291 |

FOREIGN PATENT DOCUMENTS

WO 2014060798 4/2014

* cited by examiner

*Primary Examiner* — Afroza Chowdhury
(74) *Attorney, Agent, or Firm* — Fletcher Yoder, P.C.

(57) ABSTRACT

An electronic device includes a display panel. The display panel includes a plurality of pixels, each of which includes a driving thin-film-transistor (TFT) configured to receive driving data related to the operation of a respective pixel and a light-emitting diode configured to emit light based on the driving data provided to the TFT. The display panel also includes compensation circuitry configured to generate offset data from compressed offset data and apply the offset data to the pixel data to generate the driving data.

17 Claims, 9 Drawing Sheets

SYSTEM AND METHOD FOR EXTERNAL PIXEL COMPENSATION

CROSS-REFERENCE TO RELATED APPLICATIONS

This application claims the benefit of Provisional Application Ser. No. 62/398,097, filed on Sep. 22, 2016 and entitled "System and Method for External Pixel Compensation," which is incorporated by reference in its entirety.

BACKGROUND

This disclosure relates to external compensation for shifts in operational parameters in display panels. More specifically, the current disclosure relates to performing external compensation when these operational parameters shift.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices include electronic displays, which display images by varying the amount of light that is emitted from an array of pixels of different colors. For pixels that use self-emissive elements, such as organic light emitting diodes (OLEDs), pixel non-uniformities may arise due to light-emitting diode (LED) voltage changes (e.g., Voled), and/or LED current changes (e.g., Ioled). These pixel non-uniformities could produce a degradation in image quality as pixels change over time. Changes in the pixels may be caused by many different factors. For example, changes in the pixels may be caused by temperature changes of the display, an aging of the display (e.g., aging of the thin-film-transistors (TFTs)), the operation of certain display processes, and other factors.

To counteract image degradation caused by changes in the display, it may be desirable to implement in-pixel or per-pixel compensation for the changes. Yet as pixels per inch (PPI) increase, in-pixel or per-pixel compensation logic for these changes may become more and more limited. For example, high pixel-per-inch displays may include a smaller pixel circuit footprint. Thus, a size of the in-pixel or per-pixel compensation circuits may become a limiting factor. Further, timing constraints for these high-PPI displays may result timing limitations on the in-pixel or per-pixel compensation circuits.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

To improve image quality and consistency, external compensation circuitry may be used to counter-act negative artifacts caused by variations (e.g., threshold voltage (Vth) shifts) within a pixel. Further, the external compensation circuitry may be used to counter-act negative artifacts from light-emitting diode (LED) (e.g., organic light-emitting diode) voltage shifts that may occur over time. In the current embodiments, lines carrying a data voltage (Vdata) and/or an reference voltage (Vref) may be used to sense the threshold voltages (Vth), LED voltages (Voled) and/or an LED current (e.g., Ioled) that may be used for subsequent compensation that is external to the pixel circuitry. For example, offset data based upon Vth, Voled and/or Ioled values may be used in compensation logic that adjusts a display output based upon inconsistencies between pixels of a display.

As mentioned above, in-pixel compensation may be used to correct pixel non-uniformity. Such compensation may utilize a capacitor of the pixel to store data relating to the pixel. This stored data may then be used for pixel compensation in a separate step. Unfortunately, in-pixel compensation may, at times, be slow, utilizing a significant amount of time to store data and then utilize the data for pixel compensation. Additionally, the hardware for in-pixel compensation may be significant for certain electronic devices (especially electronic devices with a small integrated circuit footprint). For example, the storage capacitor used to store the pixel information may be quite large, which can occupy a significant amount of circuitry area of a limited integrated circuit footprint.

Accordingly, in some embodiments described herein, external compensation techniques may obtain certain information about the display panel and alter the input data that is provided to display panel, prior to reaching the display panel (e.g., external to the pixel circuitry). The alterations of the input data effectively compensate for non-uniformity based upon the information obtained about the display panel. For example, non-uniformity that may be corrected using the current techniques may include: neighboring pixels that have similar data, but different luminance, color non-uniformity between neighboring pixels, pixel row inconsistencies, pixel column inconsistencies, etc. As will be discussed in more detail below, separate paths for input data and offset data may be utilized, and unique summing thereof may be performed in an area and power conserving manner to generate externally compensated pixel data for implementation on the display panel.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions are be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding additional embodiments that also incorporate the recited features.

Present embodiments relate to external compensation for non-uniformity that may occur in in display panels. More specifically, the current embodiments describe techniques for external to the pixel application of offset data, where the offset data describes the non-uniformity at a pixel level, as well as techniques to reduce power consumption and area used in conjunction with application of the external to the pixel offset data.

Figure 1:
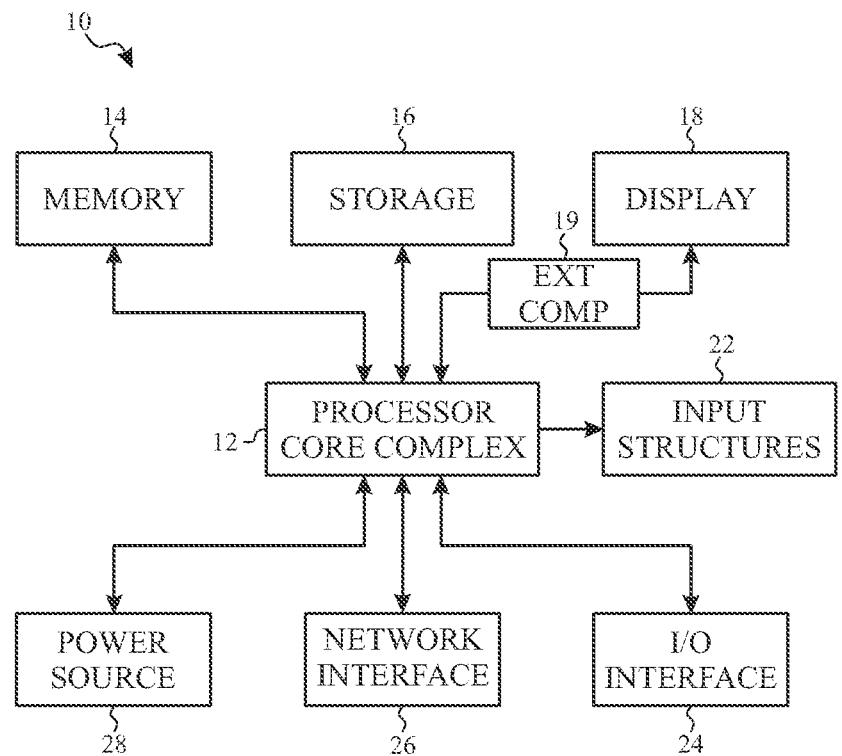
FIG. 1 is a schematic block diagram of an electronic device including a display, in accordance with an embodiment.

Turning first to FIG. 1, an electronic device 10 according to an embodiment of the present disclosure may include, among other things, a processor core complex 12 having one or more processor(s), memory 14, nonvolatile storage 16, a display 18, input structures 22, an input/output (I/O) interface 24, network interfaces 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
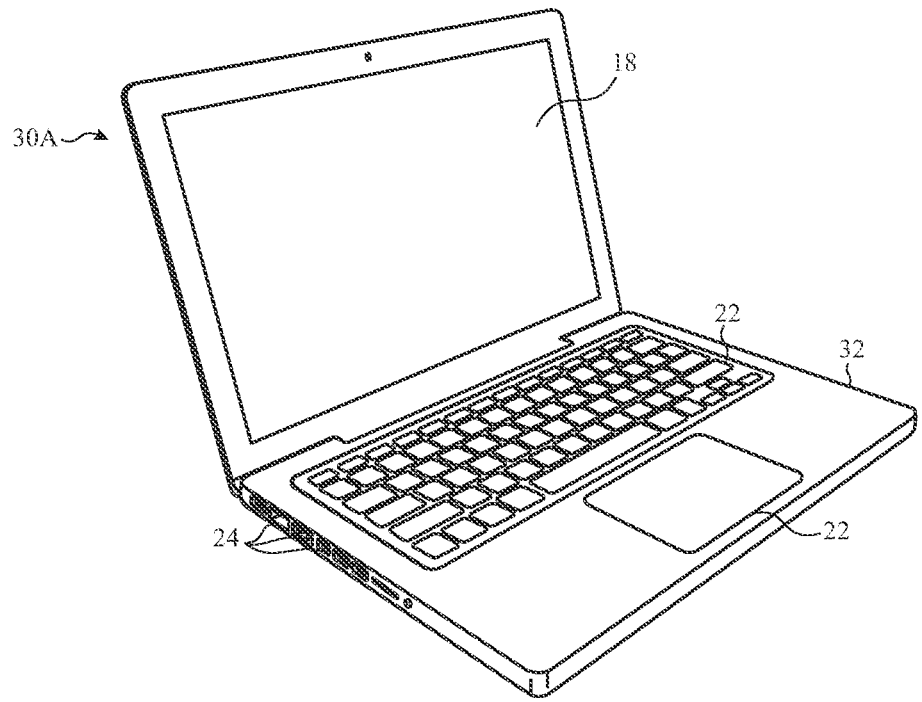
FIG. 2 is a perspective view of a notebook computer representing an embodiment of the electronic device of FIG. 1, in accordance with an embodiment.
Figure 3:
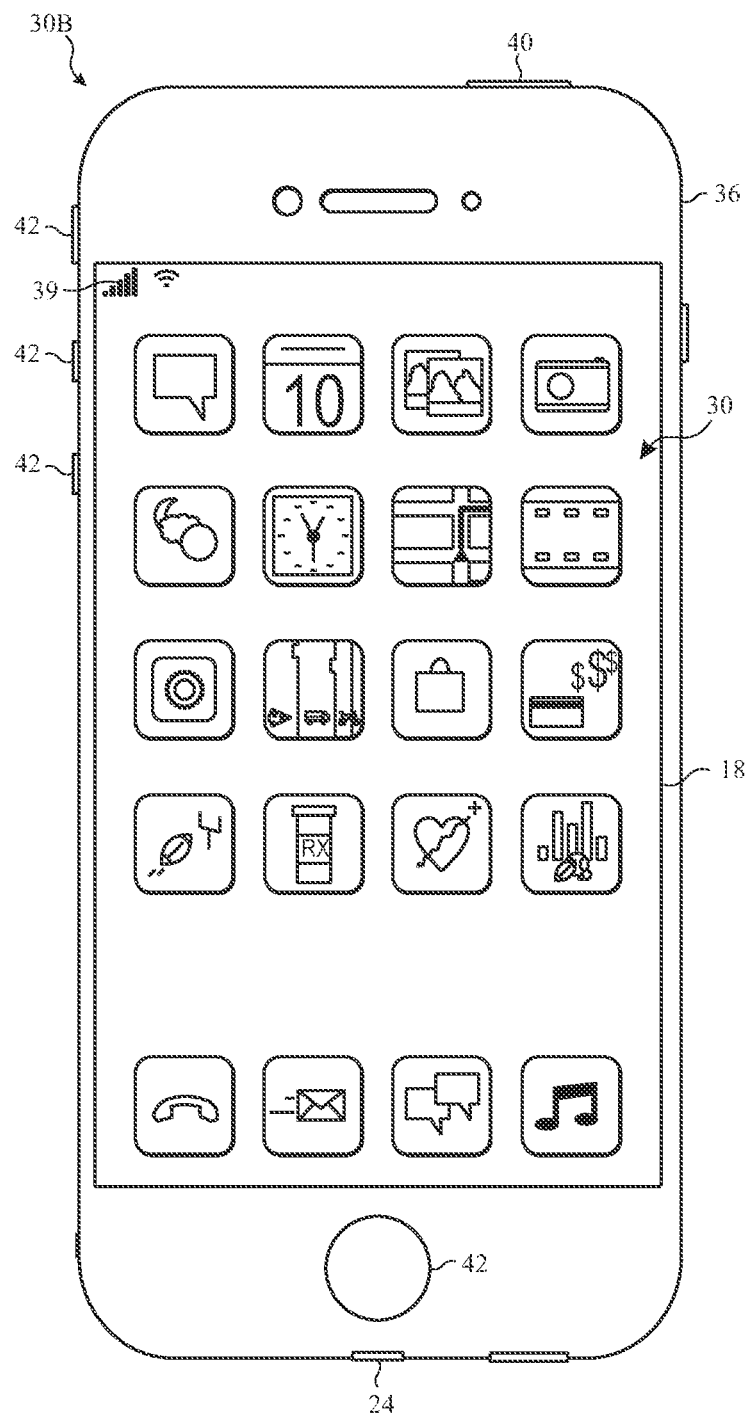
FIG. 3 is a front view of a hand-held device representing another embodiment of the electronic device of FIG. 1, in accordance with an embodiment.
Figure 4:
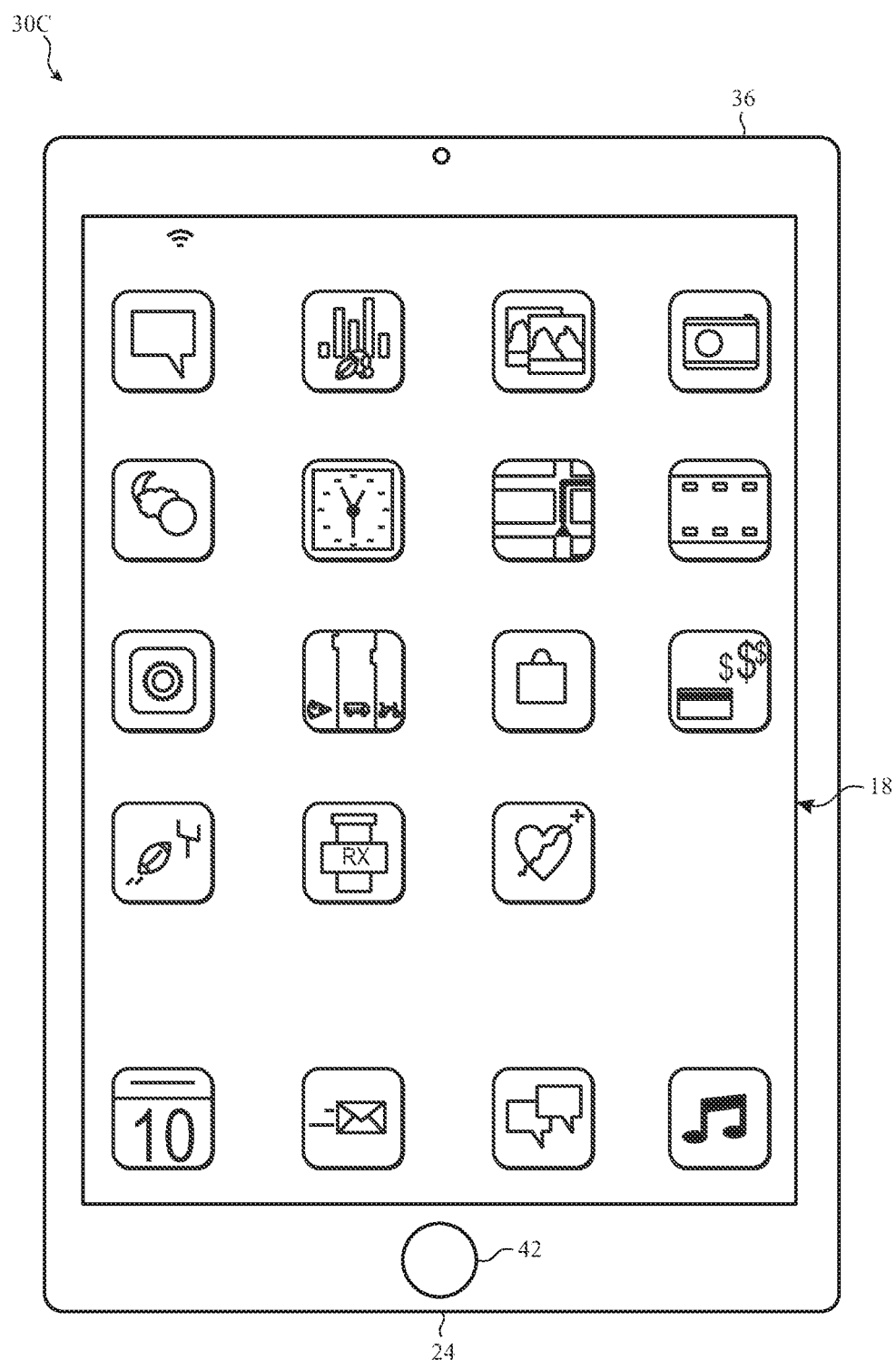
FIG. 4 is a front view of another hand-held device representing another embodiment of the electronic device of FIG. 1, in accordance with an embodiment.
Figure 5:
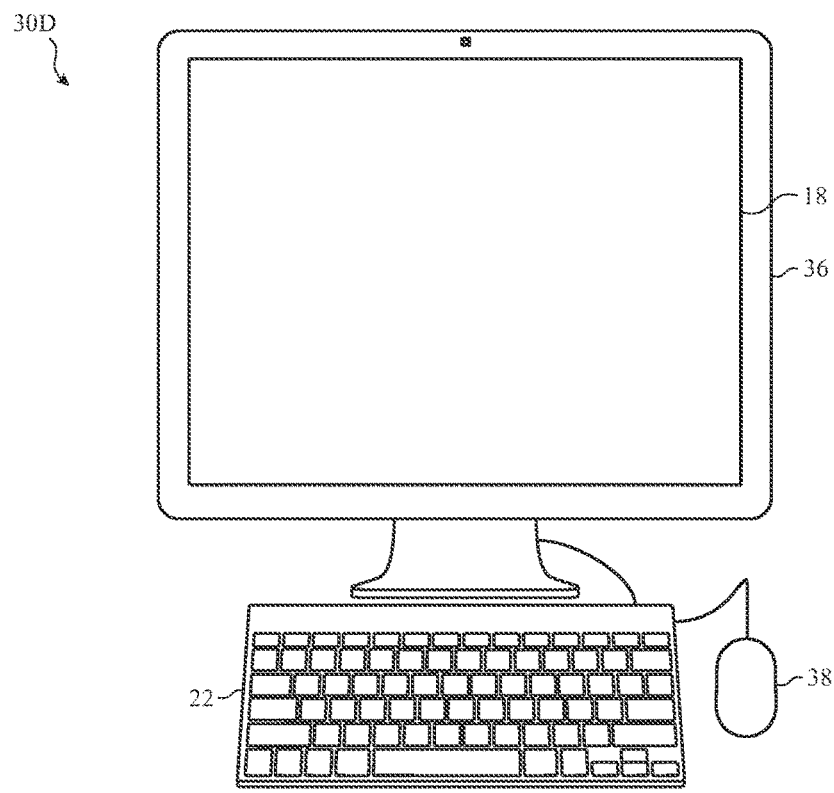
FIG. 5 is a front view of a desktop computer representing another embodiment of the electronic device of FIG. 1, in accordance with an embodiment.

By way of example, the electronic device 10 may represent a block diagram of the notebook computer 30A depicted in FIG. 2, the handheld device 30B depicted in FIG. 3, the desktop computer 30C depicted in FIG. 4, the wearable electronic device 30D depicted in FIG. 5, or similar devices. It should be noted that the processor core complex 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor core complex 12 and/or other data processing circuitry may be operably coupled with the memory 14 and the nonvolatile storage 16 to perform various algorithms. Such programs or instructions executed by the processor core complex 12 may be stored in any suitable article of manufacture that may include one or more tangible non-transitory computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor core complex 12 to enable the electronic device 10 to provide various functionalities.

As will be discussed further below, the display 18 may include pixels such as organic light emitting diodes (OLEDs), micro-light-emitting-diodes (µ-LEDs), or any other light emitting diodes (LEDs). Further, the display 18 is not limited to a particular pixel type, as the circuitry and methods disclosed herein may apply to any pixel type. Accordingly, while particular pixel structures may be illustrated in the present disclosure, the present disclosure may relate to a broad range of lighting components and/or pixel circuits within display devices.

As discussed in more detail below, external compensation circuitry 19 may alter display data that is fed to the display 18, prior to the display data reaching this display 18 (or a pixel portion of the display 18). This alteration of the display data may effectively compensate for non-uniformities of the pixels of the display 18. For example, non-uniformity that may be corrected using the current techniques may include: neighboring pixels that have similar data, but different luminance, color non-uniformity between neighboring pixels, pixel row inconsistencies, pixel column inconsistencies, etc.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interfaces 26. The network interfaces 26 may include, for example, interfaces for a personal area network (PAN), such as a Bluetooth network, for a local area network (LAN) or wireless local area network (WLAN), such as an 802.11x Wi-Fi network, and/or for a wide area network (WAN), such as a $3^{rd}$ generation (3G) cellular network, $4^{th}$ generation (4G) cellular network, or long term evolution (LTE) cellular network. The network interface 26 may also include interfaces for, for example, broadband fixed wireless access networks (WiMAX), mobile broadband Wireless networks (mobile WiMAX), asynchronous digital subscriber lines (e.g., 15SL, VDSL), digital video broadcasting-terrestrial (DVB-T) and its extension DVB Handheld (DVB-H), ultra Wideband (UWB), alternating current (14) power lines, and so forth.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10, in the form of a computer, may be a model of a MacBook®, MacBook® Pro, MacBook Air®, iMac®, Mac® mini, or Mac Pro® available from Apple Inc. By way of example, the electronic device 10, taking the form of a notebook computer 30A, is illustrated in FIG. 2 in accordance with one embodiment of the present disclosure. The depicted computer 30A may include a housing or enclosure 32, a display 18, input structures 22, and ports of an I/O interface 24. In one embodiment, the input structures 22 (such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents one embodiment of the electronic device 10. The handheld device 34 may represent, for example, a portable phone, a media player, a personal data organizer, a handheld game platform, or any combination of such devices. By way of example, the handheld device 34 may be a model of an iPod® or iPhone® available from Apple Inc. of Cupertino, Calif.

The handheld device 30B may include an enclosure 36 to protect interior components from physical damage and to shield them from electromagnetic interference. The enclosure 36 may surround the display 18, which may display indicator icons 39. The indicator icons 39 may indicate, among other things, a cellular signal strength, Bluetooth connection, and/or battery life. The I/O interfaces 24 may open through the enclosure 36 and may include, for example, an I/O port for a hard wired connection for charging and/or content manipulation using a standard connector and protocol, such as the Lightning connector provided by Apple Inc., a universal service bus (USB), or other similar connector and protocol.

User input structures 42, in combination with the display 18, may allow a user to control the handheld device 30B. For example, the input structure 40 may activate or deactivate the handheld device 30B, the input structure 42 may navigate user interface to a home screen, a user-configurable application screen, and/or activate a voice-recognition feature of the handheld device 30B, the input structures 42 may provide volume control, or may toggle between vibrate and ring modes. The input structures 42 may also include a microphone may obtain a user's voice for various voice-related features, and a speaker may enable audio playback and/or certain phone capabilities. The input structures 42 may also include a headphone input may provide a connection to external speakers and/or headphones.

FIG. 4 depicts a front view of another handheld device 30C which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

Turning to FIG. 5, a computer 30D may represent another embodiment of the electronic device 10 of FIG. 1. The computer 30D may be any computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (PC) by another manufacturer. A similar enclosure 36 may be provided to protect and enclose internal components of the computer 30D such as the display 18. In certain embodiments, a user of the computer 30D may interact with the computer 30D using various peripheral input devices, such as the input structures 22 or mouse 38, which may connect to the computer 30D via a wired and/or wireless I/O interface 24.

Figure 6:
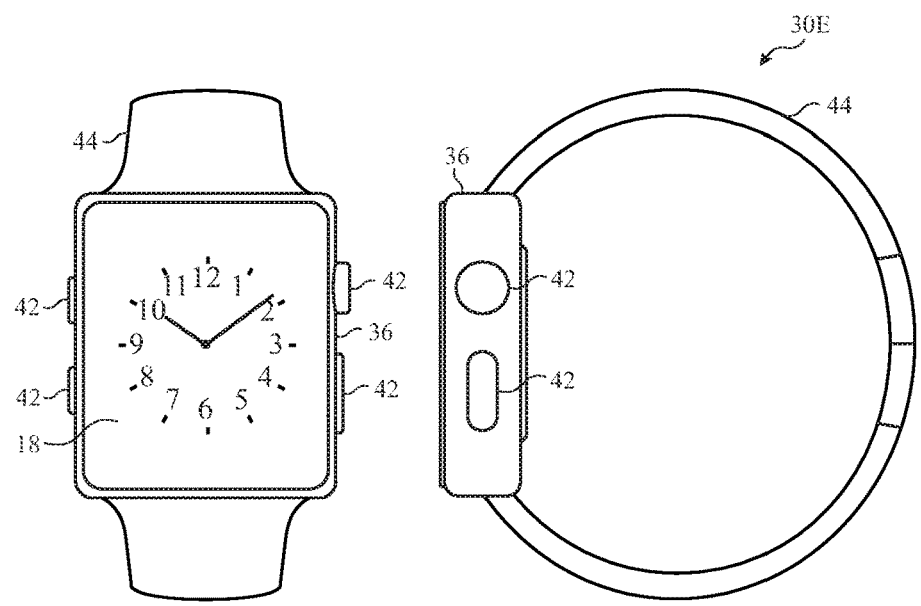
FIG. 6 is a front view of a wearable electronic device representing another embodiment of the electronic device of FIG. 1, in accordance with an embodiment.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 44, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen, which may allow users to interact with a user interface of the wearable electronic device 30E.

Figure 7:
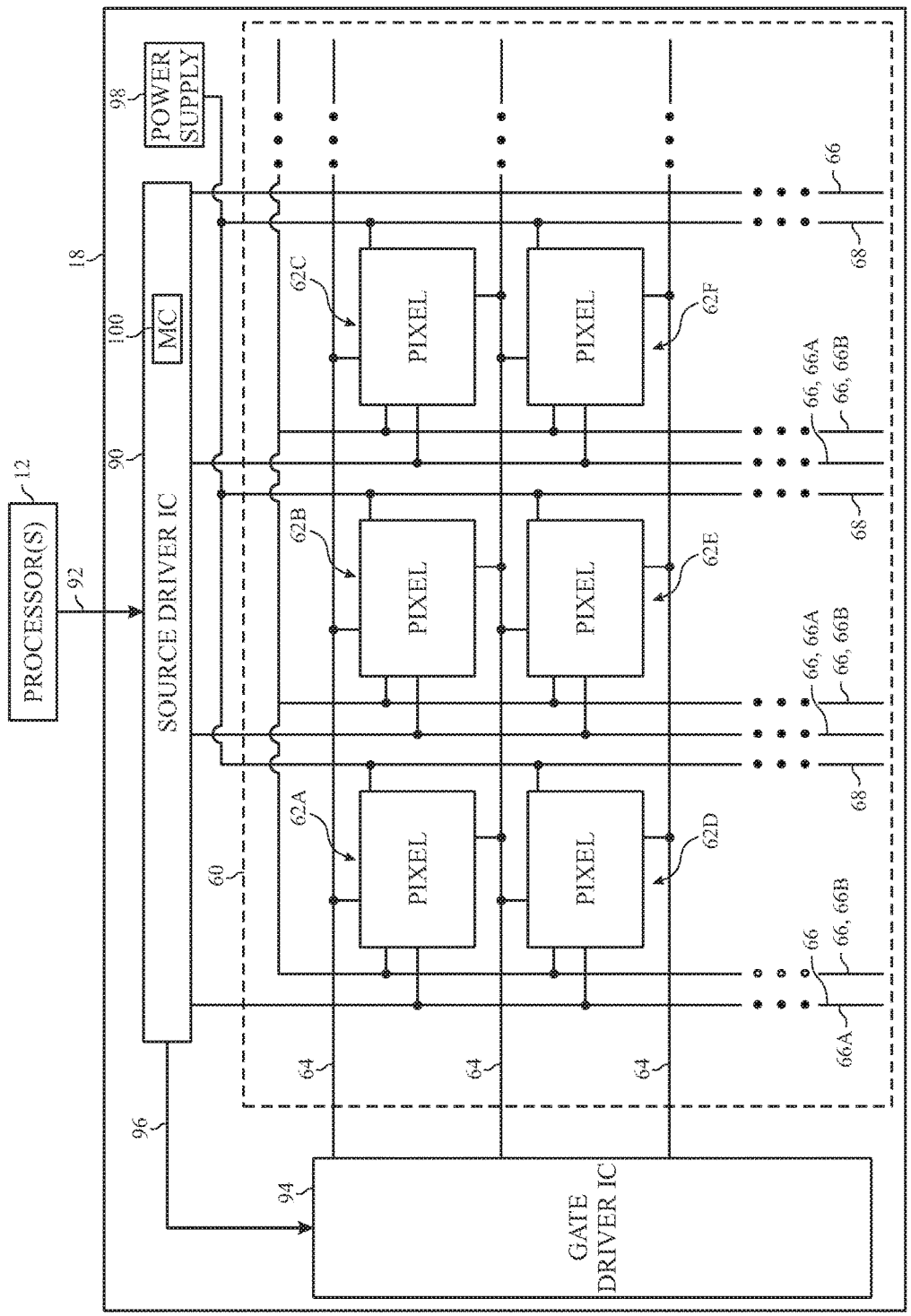
FIG. 7 is a circuit diagram illustrating a portion of an array of pixels of the display of FIG. 1, in accordance with an embodiment.

The display 18 for the electronic device 10 may include a matrix of pixels that contain light emitting circuitry. Accordingly, FIG. 7 illustrates a circuit diagram including a portion of a matrix of pixels of the display 18. As illustrated, the display 18 may include a display panel 60. Moreover, the display panel 60 may include multiple unit pixels 62 (here, six unit pixels 62A, 62B, 62C, 62D, 62E, and 62F are shown) arranged as an array or matrix defining multiple rows and columns of the unit pixels 62 that collectively form a viewable region of the display 18 in which an image may be displayed. In such an array, each unit pixel 62 may be defined by the intersection of rows and columns, represented here by the illustrated gate lines 64 (also referred to as "scanning lines") and data lines 66 (also referred to as "source lines"), respectively. Additionally, power supply lines 68 may provide power to each of the unit pixels 62. The unit pixels 62 may include, for example, a thin film transistor (TFT) coupled to a LED, whereby the TFT may be a driving TFT that facilitates control of the luminance of a display pixel 62 by controlling a magnitude of supply current flowing into the LED (e.g., an OLED) of the display pixel 62.

Although only six unit pixels 62, referred to individually by reference numbers 62a-62f, respectively, are shown, it should be understood that in an actual implementation, each data line 66 and gate line 64 may include hundreds or even thousands of such unit pixels 62. By way of example, in a color display panel 60 having a display resolution of 1024× 768, each data line 66, which may define a column of the pixel array, may include 768 unit pixels, while each gate line 64, which may define a row of the pixel array, may include 1024 groups of unit pixels with each group including a red, blue, and green pixel, thus totaling 3072 unit pixels per gate line 64. By way of further example, the panel 60 may have a resolution of 480×320 or 960×640. In the presently illustrated example, the unit pixels 62 may represent a group of pixels having a red pixel (62A), a blue pixel (62B), and a green pixel (62C). The group of unit pixels 62D, 62E, and 62F may be arranged in a similar manner. Additionally, in the industry, it is also common for the term "pixel" may refer to a group of adjacent different-colored pixels (e.g., a red pixel, blue pixel, and green pixel), with each of the individual colored pixels in the group being referred to as a "sub-pixel."

The display 18 also includes a source driver integrated circuit (IC) 90, which may include a chip, such as a processor or application specific integrated circuit (ASIC), configured to control various aspects of the display 18 and panel 60. For example, the source driver IC 90 may receive image data 92 from the processor core complex 12 and send corresponding image signals to the unit pixels 62 of the panel 60. The source driver IC 90 may also be coupled to a gate driver IC 94, which may be configured to provide/remove gate activation signals to activate/deactivate rows of unit pixels 62 via the gate lines 64. The source driver IC 90 may include a timing controller that determines and sends timing information/image signals 96 to the gate driver IC 94 to facilitate activation and deactivation of individual rows of unit pixels 62. In other embodiments, timing information may be provided to the gate driver IC 94 in some other manner (e.g., using a timing controller that is separate from the source driver IC 90). Further, while FIG. 7 depicts only a single source driver IC 90, it should be appreciated that other embodiments may utilize multiple source driver ICs 90 to provide timing information/image signals 96 to the unit pixels 62. For example, additional embodiments may include multiple source driver ICs 90 disposed along one or more edges of the panel 60, with each source driver IC 90 being configured to control a subset of the data lines 66 and/or gate lines 64.

In operation, the source driver IC 90 receives image data 92 from the processor core complex 12 or a discrete display controller and, based on the received data, outputs signals to control the unit pixels 62. When the unit pixels 62 are controlled by the source driver IC 90, circuitry within the unit pixels 62 may complete a circuit between a power source 98 and light elements of the unit pixels 62. Additionally, to measure operating parameters of the display 18, measurement circuitry 100 may be positioned within the source driver IC 90 to read various voltage and current characteristics of the display 18, as discussed in detail below.

The measurements from the measurement circuitry 100 (or other information) may be used to determine offset data for individual pixels (e.g., 62A-F). The offset data may represent non-uniformity between the pixels, such as: neighboring pixels that have similar data, but different luminance, color non-uniformity between neighboring pixels, pixel row inconsistencies, pixel column inconsistencies, etc. Further, the offset data may be applied to the data controlling the pixels (e.g., 62A-F), resulting in compensated pixel data that may effectively remove these inconsistencies. In some embodiments, the external compensation circuitry 19 may include one or more of the source driver IC 90 and the measurement circuitry 100 or may be coupled to one or more of the source driver IC 90 and the measurement circuitry 100.

Figure 8:
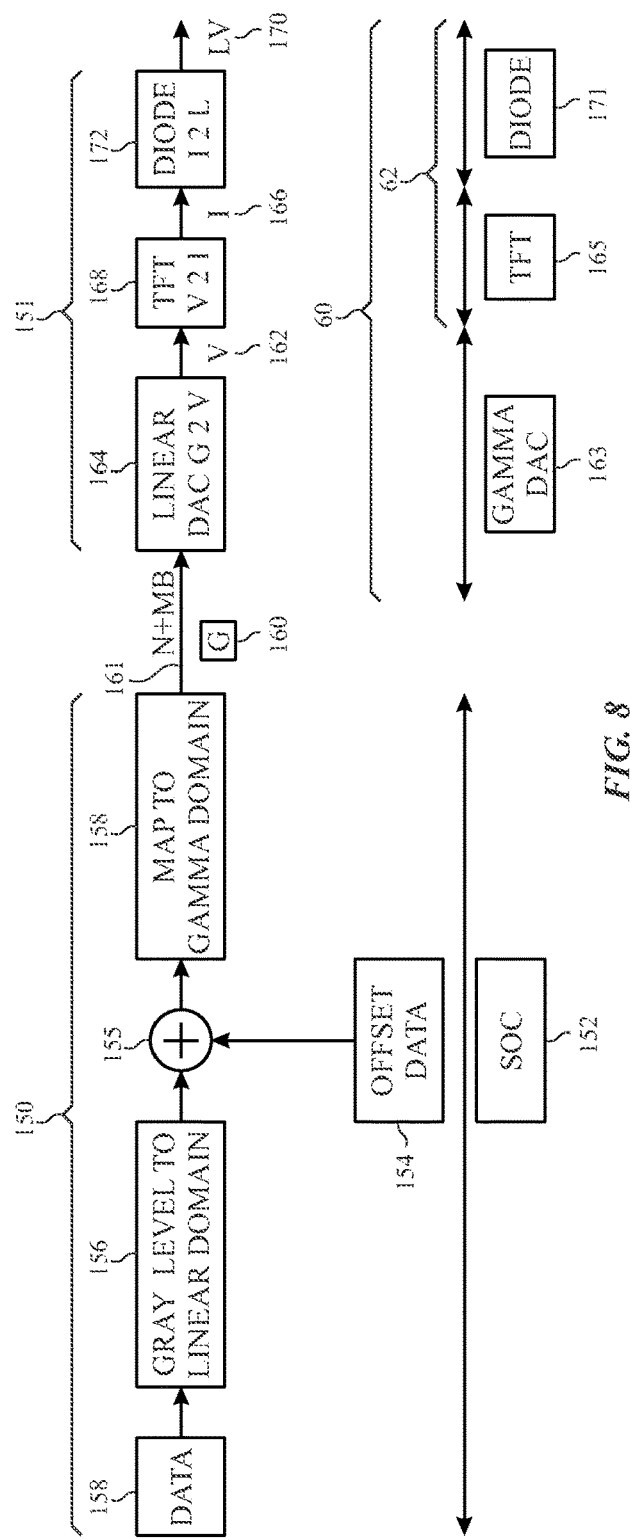
FIG. 8 is a schematic diagram illustrating a process for external compensation of pixels and subsequent processing at the display panel, in accordance with an embodiment.

With the foregoing in mind, FIG. 8 illustrates a block diagram of a process 150 for external compensation of pixels 62 and subsequent processing 151 at the display 18, in accordance with an embodiment. Circuitry such as a system on chip (SOC) 152 may be used for pre-processing of pixel data, prior to the data reaching the display panel 60. In some embodiments, the SOC 152 may be present in the external compensation circuitry 19. The pixel data in the SOC 152 is in the digital processing domain. On the SOC 152 side, offset data 154, representing the non-uniformity or mismatch between the pixels 62, is added 155 to the gray level data 156 (e.g., voltage values) of the pixels, which are determined using N byte input data 158. This addition of offset data 154 to the gray level data 156, results in N+M byte offset gray level data for each pixel. The offset gray level data is mapped to the gamma domain, as illustrated in block 159. This process 150 is implemented for each pixel 62 of the display panel 60. The mapped offset gray level data 160 for each pixel 62 (e.g., the externally compensated data for each pixel 62) is then provided 161 to the display panel 60.

The display panel 60 may then perform the display panel 60 processing 151. First, the display panel 60 may perform a linear digital-to-analog conversion, converting the data 160 from gray level data (G) to voltage (v) 162 (e.g., via a Gamma DAC 163), as illustrated by block 164. The voltage 162 may be applied to the driving TFT 165, resulting in a current (I) 166, as illustrated by block 168. The current 166 is then applied to a diode of the pixel 62, resulting in outputted light or luminance (Lv) 170 at a diode 171 of the pixel 62, as illustrated by block 172.

The transformations in the SOC 152 may be complex, and could result in additional errors at times. These errors may contribute to non-uniformity of the pixels 62, such as color-mismatching, etc. Further, the increase in input data size (e.g., N+M byte data), may result in an interface that uses higher bandwidth, and thus, uses more power, as well as increased precision to be handled by the DAC 163.

Figure 9:
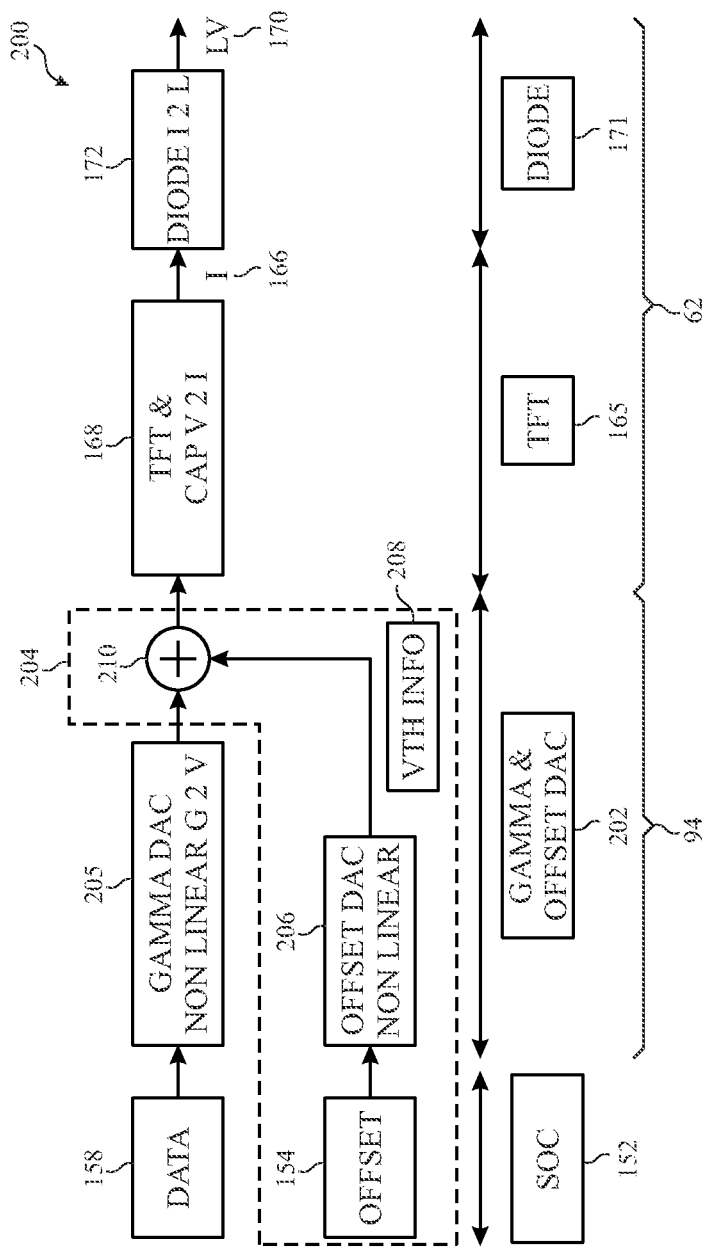
FIG. 9 is a schematic diagram illustrating offset data applied in the driver integrated circuit, in accordance with an embodiment.

In some embodiments, it may be beneficial to apply offset information for the pixel compensation in the driver integrated circuit. FIG. 9 illustrates such an embodiment of circuitry 200, where the offset data is applied in a driver integrated circuit (e.g., one of driver IC 90, driver IC 94, or the like), rather than in the SOC 152 or in the pixel 62. As mentioned above, in the embodiment of FIG. 8, the SOC 152 is modified to allow the offset data 154 to be added 155 to the gray level data 156. Further, because the embodiment of FIG. 8 performs processing in the digital domain, a linear DAC 164 is used to convert the digital gray level data 160 to voltage. In other words, the nonlinear data is mapped to linear data and then back to nonlinear data. Accordingly, the embodiment of FIG. 9, which, for example, implements the offset data 154 addition in the driver IC 90, may be beneficial, in that the display pipeline architecture may not be affected by the external compensation. For example, the SOC 152 and pixel 62 may remain untouched. Further, as illustrated in FIG. 9, two parallel interfaces (e.g., inputs) may be user to receive the pixel 62 data 158 and the offset data 154, per pixel 62, resulting in increased processing speed.

To perform the external compensation, circuitry is added (e.g., in driver IC 90), to perform the external compensation operations that are provided in the dashed box 204. As illustrated in FIG. 9, the data 158 for each pixel 62 is provided to a nonlinear gamma DAC 205 (e.g., in one of driver IC 90 or driver IC 94). Serially or in parallel with the data 158, the offset data 154 for each pixel 62 is provided to a linear offset DAC 206 of, for example, the driver IC 90. The digital-to-analog conversion results in analog offset information (Vth information) 208. The Vth information 208 is added via an addition 210 function to the outputted voltage of the DAC 205 in, for example, the driver IC 90. The compensated voltage is passed from the addition 210 function, to the pixel 62, where the voltage is applied to the driving TFT 165, resulting in a current 166 (block 168). The current 166 is applied to the diode 171, resulting in light or luminance (Lv) 170 emitted by the diode 171. Additionally, the processing of FIG. 9 may be completed in either the current domain or the voltage domain.

As previously noted two parallel interfaces may send the pixel 62 data 158 and the offset data 154, per pixel 62, resulting in increased processing speed. This is in contrast to an external compensation approach in which the gamma DAC 205 is implemented using additional bits to extend the range of the DAC output, whereby the SOC 152, for example, sends data having extra bits over the high-speed link to the driver IC 90. Adding bits to extend the range of the DAC output may result in additional complexity in design and increases the bandwidth and power consumption by the link. Accordingly, in present embodiments, power consumption and design complexity may be reduced by allowing the main data path to remain a standard 8-bit gamma link, while employing a side channel to provide the offset data 154 to drive the linear offset DAC 206 providing compensation.

Figure 10:
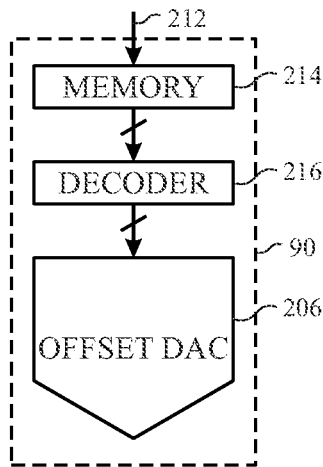
FIG. 10 is a schematic diagram illustrating generation of the offset data of FIG. 9, in accordance with an embodiment.

FIG. 10 illustrates an embodiment for utilizing a side channel 212 to receive data for use in the linear offset DAC 206 for example, from the SOC 152. In some embodiments, the side channel 212 may be a low power path, such as a serial to peripheral (SPI) path or the like, and may be coupled to a memory device 214 via an input (e.g., an SPI input), whereby the memory may be used as a frame buffer. The memory device 214 can include flash memory, static random access memory (SRAM), or the like. Additionally, to reduce the size of memory 214, the data transmitted along side channel 212 may be compressed data (e.g., compressed and transmitted by the SOC 152). This compressed data may be accessed from the memory device 214 and transmitted to a decoder 216, which may operate to decompress the compressed data into the offset data 154 for transmission to the linear offset DAC 206. This allows for the use of a smaller memory size for memory 214, resulting in a good manufacturing yield along with a significantly lower power consumption link for the side channel 212 than the main high-speed data link coupled to the gamma DAC 205 would otherwise provide, which results in reducing power overhead.

Figure 11:
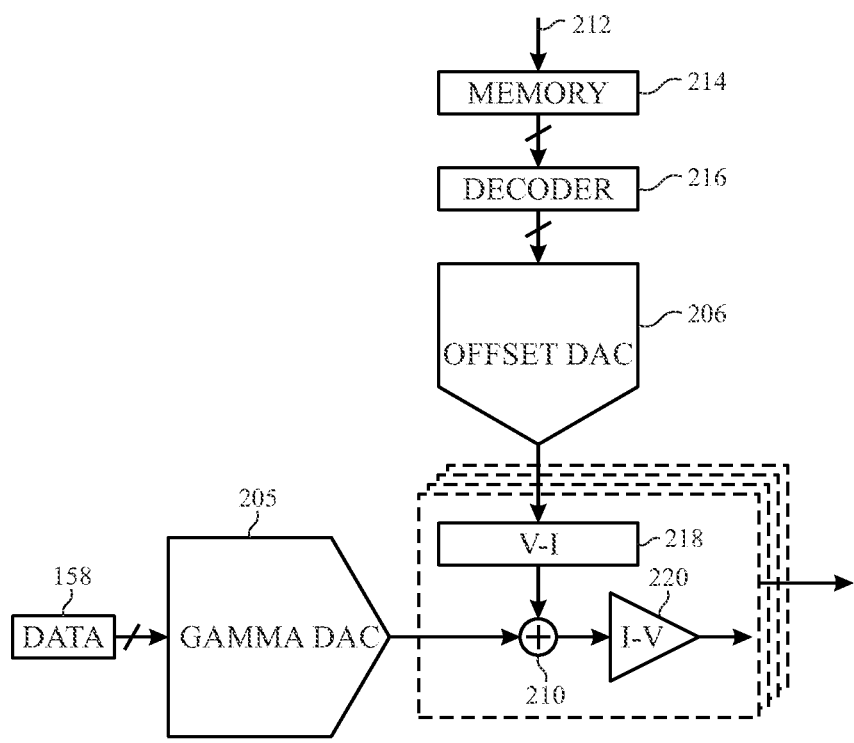
FIG. 11 is a schematic diagram illustrating circuitry that applies the offset data of FIG. 9 to the array of pixels of FIG. 6, in accordance with an embodiment.

Using an offset DAC 206 to implement compensation may include summing 210 the gamma voltage along with the offset voltage (e.g., the Vth information 208) before driving the pixel 62. This summation 210 may be implemented in the current domain. Accordingly, as illustrated in FIG. 10, the linear offset DAC 206 may be operating a current mode. However, as the offset DAC 206 will be used to drive all columns of the pixel array, it may be impractical to utilize a current offset DAC as the offset DAC 206. Instead, as illustrated in FIG. 11, the offset DAC 206 may operate as a voltage DAC. The offset DAC 206 may be coupled to a voltage to current (V2I) converter 218 prior to the summation 210. Additionally, because the driving TFT 165 works with voltage, a current to voltage (I2V) converter 220, such as a source amplifier, may be utilized to convert the compensated current to voltage, such that voltage is provided to the TFT 165.

The system illustrated in FIG. 10 may utilize a V2I converter 218 for each column of the pixel array, since the offset is generated for each column in the pixel array. This may lead to a large power overhead since for example, for 1242×2 channels using 1 µA per V2I converter 218 would use 2.5 mA. Having a 6V power supply, for example, this would lead to 15 mW of power usage. Accordingly, the system of FIG. 10 may result in a relatively large power overhead. To assist in reducing the power consumption, alternate techniques and circuitry may be utilized.

FIG. 11 illustrates one such alternative.

Figure 12:
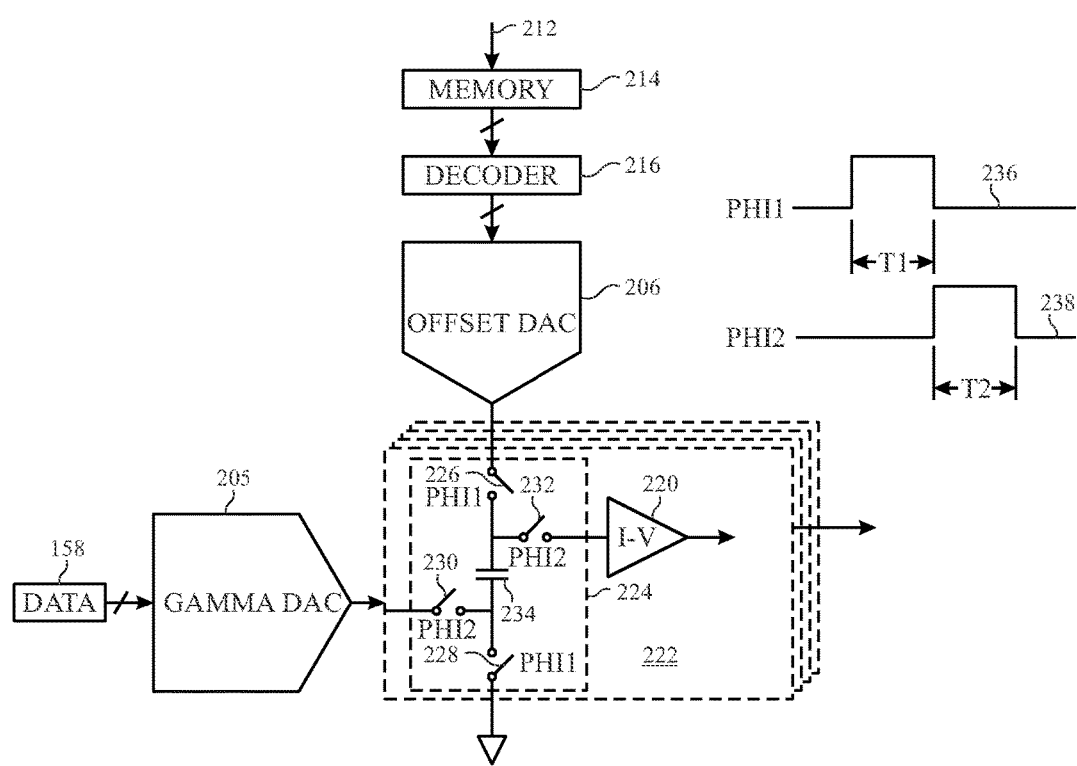
FIG. 12 is a schematic diagram illustrating second circuitry that applies the offset data of FIG. 9 to the array of pixels of FIG. 6, in accordance with an embodiment.

FIG. 12 illustrates a low power charge summing circuit 222 that may allow for charge summing at a reduced amount relative to the system of FIG. 11. As illustrated, the charge summing circuit 222 may take the place of the V2I converter 218 and the summing 210 of FIG. 11. Instead of operating in a continuous-time fashion (as illustrated in FIG. 11), the charge summing circuit 222 takes advantage of the discrete-time nature of the driver IC 94 and uses a switched-capacitor circuit 224 to implement summation. Furthermore, this technique does not include any additional amplification or voltage-current domain switching circuitry, which reduces both the area and power consumption.

As illustrated in FIG. 12, the switched-capacitor circuit 224 includes switches 226, 228, 230, and 232 as well as a capacitor 234. It should be understood that different configurations of the switched-capacitor circuit 224 may be implemented. In operation, the capacitor 234 may be charged by the offset voltage for a first time period T1 (e.g., by closing switches 226 and 228, as illustrated via timing diagram 236). Time period T1 may be set to an amount of time to charge the capacitor 234 to the voltage level transmitted from the offset DAC (e.g., the offset voltage, Vth information 208). During a second time period T2 (which may be equal to or different from the duration of time period T1) illustrated in timing diagram 238, switches 226 and 228 may be opened while switches 230 and 232 are closed. This operates to connect the bottom of the capacitor to the gamma DAC 205 and the top of the capacitor 234 to the I2V converter 220. This connection causes the voltage at the bottom plate of the capacitor to change (e.g., increase) to the nominal gamma voltage. Additionally, as the capacitor 234 cannot change voltage instantly, the top plate of the capacitor 234 is boosted to the sum of the nominal gamma voltage and the offset voltage, which is transmitted to the I2V converter 220 for conversion of the compensated current to voltage for transmission to the driving TFT 165. Subsequently, the process may be repeated for additional columns of the pixel array (e.g., switches 230 and 232 can be opened while switches 226 and 228 are closed for time period T1).

In this manner, power of the charge summing circuit 222 is dominated by the charging and discharging of the capacitor 234. This may be reduced through selection of a relatively small capacitor as capacitor 234. For example, if a 50 femtofarad (fF) capacitor is utilized in the charge summing circuit 222 with a 6V power supply at 120 Hz operating frequency, the power consumed is 0.8 mW. Accordingly, the advantages of separate path transmission of data 158 and offset data 154 may be realized without incurring large additional power and/or area penalties.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device, comprising:
   a display panel, comprising:
     a plurality of pixels, each pixel of the plurality of pixels comprising:
       a driving thin-film-transistor (TFT) configured to receive driving data related to an operation of a respective pixel; and
       a light-emitting diode configured to emit light based on the driving data provided to the TFT; and
     compensation circuitry configured to generate offset data from compressed offset data and apply the offset data to pixel data to generate the driving data at least in part by transmitting the offset data for a period of time before transmitting the pixel data, wherein the compensation circuitry comprises:
       a gamma digital-to-analog converter (DAC); and
       an offset DAC, wherein the compensation circuitry is configured to provide compensated pixel data as the driving data by adding an output of the gamma DAC and the output of the offset DAC.

2. The electronic device of claim 1, comprising a driver integrated circuit (IC) comprising the compensation circuitry.

3. The electronic device of claim 2, wherein the driver IC comprises a first input configured to receive the pixel data.

4. The electronic device of claim 3, wherein the driver IC comprises a second input configured to receive the compressed offset data, wherein the second input comprises a serial peripheral interface input.

5. The electronic device of claim 4, wherein the driver IC comprises a memory coupled to the second input, wherein the memory is configured to store the compressed offset data.

6. The electronic device of claim 5, wherein the driver IC comprises a decoder coupled to the memory, wherein the decoder is configured to decompress the compressed offset data to generate the offset data.

7. The electronic device of claim 2, wherein the driver IC is configured to receive the compressed offset data in parallel with the pixel data.

8. The electronic device of claim 1, comprising a processing unit, wherein the processing unit is configured to provide the pixel data and the compressed offset data to the compensation circuitry along separate paths.

9. A method, comprising:
   receiving grey level pixel data;
   converting the grey level pixel data via a gamma digital to analog converter (DAC) into converted pixel data;
   converting offset data related non-uniformity between a plurality of pixels into converted offset data via an offset DAC;
   applying the converted offset data to the converted pixel data in a summing circuit comprising a switched-capacitor circuit that receives the converted offset data to generate compensated driving data at least in part by closing a first switch of the switched-capacitor circuit to couple a capacitor of the switched-capacitor circuit to the offset DAC for a first time period; and
   controlling emission of light from a light-emitting diode of a pixel of the plurality of pixels based on the compensated driving data.

10. The method of claim 9, comprising applying the converted offset data to the converted pixel data by opening the first switch of the switched-capacitor circuit and closing a second switch of the switched-capacitor circuit to couple the capacitor of the switched-capacitor circuit to the gamma DAC.

11. The method of claim 10, comprising applying the converted offset data to the converted pixel data by opening the first switch of the switched-capacitor circuit and closing the second switch of the switched-capacitor circuit for a second time period.

12. The method of claim 9, wherein controlling the emission of light from the light-emitting diode comprises converting the compensated driving data to a driving voltage and supplying the driving voltage to a thin-film-transistor (TFT) associated with the light-emitting-diode.

13. The method of claim 9, comprising receiving the grey level pixel data separately from the compressed offset data and decompressing the compressed offset data to generate the offset data.

14. An electronic display, comprising:
   compensation circuitry comprising:
     a first input configured to receive pixel data related to generating an image on a display comprising a plurality of pixels;
     a second input configured to receive, separate from receiving the pixel data, compressed offset data related to non-uniformity between the plurality of pixels;
     a decoder configured to decompress the compressed offset data to generate offset data;
     an offset digital-to-analog converter (DAC) coupled to the decoder and configured to convert the offset data into converted offset data;
     a gamma DAC configured to convert the pixel data into converted pixel data; and
     a summing circuit coupled to the offset DAC and the gamma DAC and configured to:
       close a switch coupled between an input to the summing circuit and an output of the summing circuit; and
       add, in response to the closing of the switch, the converted offset data to the converted pixel data to generate driving data to compensate for the non-uniformity between the plurality of pixels.

15. The electronic display of claim 14, wherein the summing circuit comprises a capacitor coupled to a first switch and a second switch.

16. The electronic display of claim 15, wherein the first switch is coupled to the offset DAC, wherein the first switch is configured to be toggled to selectively couple the capacitor to the offset DAC for a first time period.

17. The electronic display of claim 16, wherein the second switch is coupled to the gamma DAC, wherein the second switch is configured to be toggled to selectively couple the capacitor to the gamma DAC for a second time period.

* * * * *